United States Patent
Huang

(10) Patent No.: US 11,464,125 B2
(45) Date of Patent: Oct. 4, 2022

(54) ELECTRONIC DEVICE

(71) Applicant: ALTEK BIOTECHNOLOGY CORPORATION, Hsinchu (TW)

(72) Inventor: Yu-Cheng Huang, Hsinchu County (TW)

(73) Assignee: ALTEK BIOTECHNOLOGY CORPORATION, Hsinchu (TW)

( * ) Notice: Subject to any disclaimer, the term of this patent is extended or adjusted under 35 U.S.C. 154(b) by 204 days.

(21) Appl. No.: 17/012,057

(22) Filed: Sep. 4, 2020

(65) Prior Publication Data

US 2022/0030729 A1 Jan. 27, 2022

(30) Foreign Application Priority Data

Jul. 22, 2020 (TW) .................................. 109124675

(51) Int. Cl.
*H05K 5/06* (2006.01)

(52) U.S. Cl.
CPC ............. *H05K 5/069* (2013.01); *H05K 5/062* (2013.01)

(58) Field of Classification Search
CPC ...... H01R 13/5205; H01R 13/52; H01B 7/28; H01B 7/282; H02G 15/013; H05K 5/062; H05K 5/069
See application file for complete search history.

(56) References Cited

U.S. PATENT DOCUMENTS

| | | | | |
|---|---|---|---|---|
| 5,281,757 | A | * | 1/1994 | Marin .................... H01B 9/022 174/106 SC |
| 9,907,456 | B2 | | 3/2018 | Miyoshi |
| 2021/0167587 | A1 | * | 6/2021 | Komori .................... H02G 1/14 |
| 2021/0313093 | A1 | * | 10/2021 | Komori ................ H02G 3/0462 |

FOREIGN PATENT DOCUMENTS

| | | | | |
|---|---|---|---|---|
| CN | 204011947 | | 12/2014 | |
| CN | 207745105 | | 8/2018 | |
| CN | 108492923 | | 9/2018 | |
| CN | 108492923 | A * | 9/2018 | ............... H01B 7/18 |
| TW | 201230549 | | 7/2012 | |
| TW | M539904 | | 4/2017 | |
| WO | 2018153247 | | 8/2018 | |

OTHER PUBLICATIONS

"Office Action of Taiwan Counterpart Application", dated May 10, 2021, pp. 1-4.

* cited by examiner

*Primary Examiner* — Hoa C Nguyen
*Assistant Examiner* — Amol H Patel
(74) *Attorney, Agent, or Firm* — JCIPRNET

(57) ABSTRACT

An electronic device includes an outer case, a wire assembly, and a water-proof glue member. The outer case has an inner space and a hole communicating with the inner space. The wire assembly extends from the inner space of the outer case to outside of the outer case through the hole. The wire assembly includes a plurality of wires, a flexible tube covering the wires, and a hard supporting tube located between the wires and the flexible tube. The water-proof glue member is disposed between a wall surface of the outer case surrounding the hole and the wire assembly.

11 Claims, 3 Drawing Sheets

ELECTRONIC DEVICE

CROSS-REFERENCE TO RELATED APPLICATION

This application claims the priority benefit of Taiwan application serial no. 109124675, filed on Jul. 22, 2020. The entirety of the above-mentioned patent application is hereby incorporated by reference herein and made a part of this specification.

BACKGROUND

Technical Field

The disclosure relates to an electronic device, and in particular, to an electronic device with an exposed wire assembly.

Description of Related Art

Generally speaking, water-proof glue is provided at a junction of an outer case of an electronic device and a wire assembly protruding from the outer case, to achieve a waterproof effect at the junction. However, because an outermost flexible tube of the wire assembly may collapse or deform under long-term use or temperature changes, a gap between the outer case and the wire assembly may increase, causing the water-proof glue to break and waterproof failure.

SUMMARY

The disclosure provides an electronic device, which may reduce the probability of collapse or deformation of a flexible tube of a wire assembly.

An electronic device of the disclosure includes an outer case, a wire assembly, and a water-proof glue member. The outer case has an inner space and a hole communicating with the inner space. The wire assembly extends from the inner space of the outer case to outside of the outer case through the hole and includes a plurality of wires, a flexible tube covering the wires, and a hard supporting tube located between the wires and the flexible tube. The water-proof glue member is disposed between a wall surface of the outer case surrounding the hole and the wire assembly.

In an embodiment of the disclosure, the hard supporting tube is at least located in the hole and at least surrounds positions of the wires corresponding to the wall surface.

In an embodiment of the disclosure, an outer diameter of the hard supporting tube is greater than or equal to an inner diameter of the flexible tube.

In an embodiment of the disclosure, the hard supporting tube has a first end portion and a second end portion opposite to each other, the first end portion is located in the inner space of the outer case or in the hole and close to the inner space, the second end portion is located outside the outer case or in the hole and away from the inner space, and the first end portion is in a horn shape that expands toward the inner space.

In an embodiment of the disclosure, the second end portion has a chamfer or a rounded corner.

In an embodiment of the disclosure, the water-proof glue member has a barb portion extending to an inner surface of the first end portion.

In an embodiment of the disclosure, the electronic device further includes a flexible water-proof member sleeved at a junction of the outer case and a position at which the wire assembly passes through the outer case, where the flexible water-proof member includes a first part and a second part respectively pressing against the outer case and the wire assembly, and second part corresponds to a local portion of the hard supporting tube.

In an embodiment of the disclosure, an outer surface of the outer case is a conical surface inclined toward the second part at a position beside the hole, and the water-proof glue member has an inclined corner portion extending to the conical surface.

In an embodiment of the disclosure, the electronic device further includes a flexible water-proof member located in the hole of the outer case and sleeved on the wire assembly, to press against the outer case and the wire assembly, where the flexible water-proof member corresponds to a local portion of the hard supporting tube.

In an embodiment of the disclosure, the wall surface has a conical surface inclined outward, and the water-proof glue member has an inclined corner portion extending to the conical surface.

In an embodiment of the disclosure, the water-proof glue member has an annular recess corresponding to the local portion, and the flexible water-proof member is disposed in the annular recess.

In an embodiment of the disclosure, the outer case includes a plurality of positioning ribs located in the hole and protruding from the wall surface, the plurality of positioning ribs extend in an axial direction of the hole, the wire assembly is located between the plurality of positioning ribs, a plurality of glue grooves are formed among the plurality of positioning ribs, and the water-proof glue member is at least located in the plurality of glue grooves.

Based on the above, in the electronic device of the disclosure, a hard supporting tube is disposed between the wire and the flexible tube, and the hard supporting tube is located inside the flexible tube and is capable of providing support for the flexible tube. In this way, the probability of collapse or deformation of the flexible tube of the wire assembly may be reduced, the probability of rupture of the water-proof glue member between the wall surface of the outer case around the hole and the wire assembly is thereby reduced, and waterproof stability is further improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
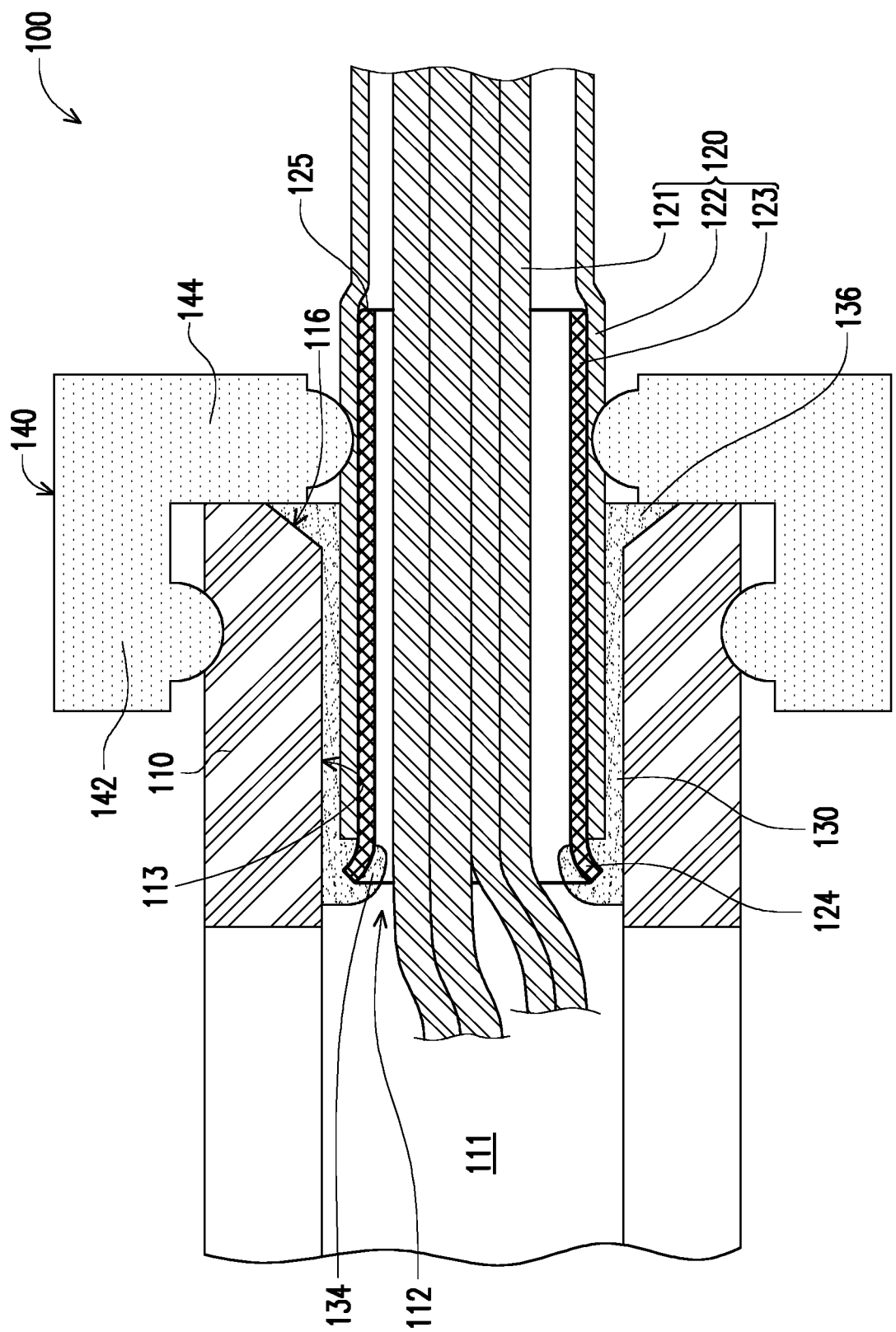
FIG. 1 is a schematic partial cross-sectional view of an electronic device according to an embodiment of the disclosure.
Figure 2:
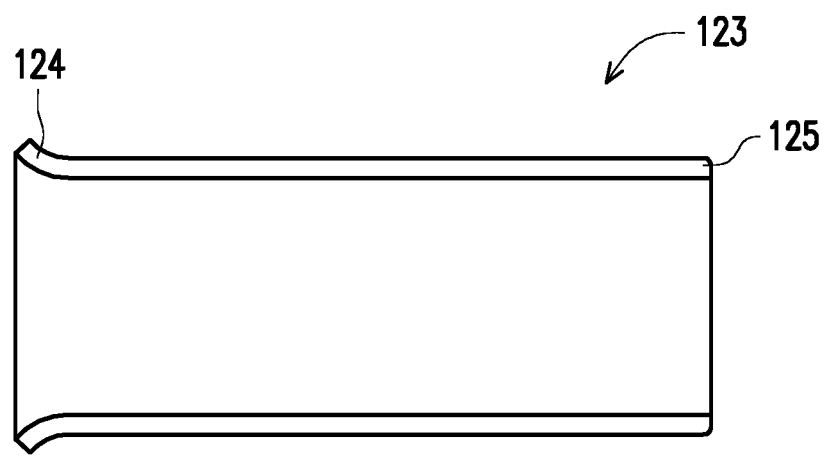
FIG. 2 is a schematic cross-sectional view of a hard supporting tube of the electronic device of FIG. 1.

FIG. 1 is a schematic partial cross-sectional view of an electronic device according to an embodiment of the disclosure. FIG. 2 is a schematic cross-sectional view of a hard supporting tube of the electronic device of FIG. 1. It should be noted that, in order to clearly show a structure in which a wire assembly of the electronic device penetrates out from inside to outside of an outer case, FIG. 1 only shows a part of the electronic device.

Referring to FIG. 1 and FIG. 2, in the present embodiment, an electronic device 100 includes an outer case 110, a wire assembly 120, and a water-proof glue member 130. A size of the electronic device 100 may be a miniaturized size, but is not limited thereto. The outer case 110 has an inner space 111 and a hole 112 communicating with the inner space 111, and the hole 112 penetrates the outer case 110. In FIG. 1, only a part of the outer case 110 is schematically shown, especially a wall surface 113 of the outer case 110 surrounding the hole 112.

The wire assembly 120 extends from the inner space 111 of the outer case 110 through the hole 112 to the outside of the outer case 110. The wire assembly 120 includes a plurality of wires 121, a flexible tube 122 covering the wires 121, and a hard supporting tube 123 located between the wires 121 and the flexible tube 122. In the present embodiment, these wires 121 may include charging wires 121 to charge the electronic device 100, or may include signal transmission wires 121 to transmit signals to or receive from the electronic device 100. Types of the wires 121 are not limited thereto.

Generally speaking, in order to simplify the number of exposed wires 121 and reduce the probability of damage to the wires 121, the flexible tube 122 is sleeved on the wires 121, so that the wires 121 may be deemed as a whole for convenience of taking and may be protected.

However, because there is a gap between the flexible tube 122 and these wires 121, in order to prevent the flexible tube 122 from collapsing and deforming during long-term use or temperature changes, in the present embodiment, a hard supporting tube 123 is disposed between the wires 121 and the flexible tube 122, and the hard supporting tube 123 is located inside the flexible tube 122, thereby providing support for the flexible tube 122. In this way, the probability of collapse or considerable deformation of the flexible tube 122 of the wire assembly 120 may be reduced.

In addition, in FIG. 1, the water-proof glue member 130 is disposed between the wall surface 113 of the outer case 110 surrounding the hole 112 and the wire assembly 120, to seal the gap between the wall surface 113 surrounding the hole 112 and the wire assembly 120 to prevent an external liquid from flowing in from the gap between the wall surface 113 and the wire assembly 120, thereby achieving a water-proof effect.

In the present embodiment, because the hard supporting tube 123 is located inside the flexible tube 122 and may provide support for the flexible tube 122 to avoid the flexible tube 122 from collapsing and deforming. In addition, the position of the hard supporting tube 123 at least corresponds to the position of the water-proof glue member 130, so that the hard supporting tube 123 may further maintain the gap between the wall surface 113 and the flexible tube 122, thereby reducing the probability of rupture of the water-proof glue member 130 due to the collapse or large deformation of the flexible tube 122.

For example, the hard supporting tube 123 is at least located in the hole 112, and at least surrounds positions of the wires 121 corresponding to the wall surface 113. Specifically, in the present embodiment, as shown in FIG. 1, the hard supporting tube 123 has a first end portion 124 and a second end portion 125 opposite to each other, and the first end portion 124 is located in the hole 112 and close to the inner space 111, and the second end portion 125 is located outside the outer case 110, so that the hard supporting tube 123 extends from inside of the hole 112 of the outer case 110 to outside of the outer case 110. Certainly, a relative position between the hard supporting tube 123 and the outer case 110 is not limited thereto.

It should be noted that the technology of the present embodiment may be applied to a microelectronic device 100. Even if such type of microelectronic device 100 is limited by space, strength of the flexible tube 122 or the water-proof glue member 130 cannot be increased by increasing an outward wall thickness of the flexible tube 122 or a thickness of the water-proof glue member 130. However, the position of the flexible tube 122 relative to the wall surface 113 may be maintained by disposing the hard supporting tube 123 inside the flexible tube 122 in the present embodiment, thereby avoiding the deformation of the water-proof glue member 130 and achieving good water-proof performance. Certainly, the technology of the present embodiment may be applied to a microelectronic device 100, which is not limited thereto.

In addition, because the hard supporting tube 123 may effectively maintain the position of the flexible tube 122 relative to the wall surface 113, the waterproof effect may not be affected even if the material selected for the flexible tube 122 has a low bonding force with the water-proof glue member 130. A material of the flexible tube 122 may be Teflon, PP, or the like, and a material of the hard supporting tube 123 may be plastic, aluminum, copper, or stainless steel, but the material of the flexible tube 122 and the hard supporting tube 123 is not limited thereto.

In addition, as shown in FIG. 2, in the present embodiment, the first end portion 124 of the hard supporting tube 123 is in a horn shape that expands toward the inner space 111 (FIG. 1), and the second end portion 125 of the hard supporting tube 123 has a chamfer or a rounded corner. The horn-shaped structure of the first end portion 124 may improve the efficiency of threading these wires 121 into the hard supporting tube 123, and the chamfer or rounded corner of the second end portion 125 may improve the efficiency of penetrating the hard supporting tube 123 into the flexible tube 122.

In addition, as shown in FIG. 1, the water-proof glue member 130 has a barb portion 134 extending to an inner surface of the first end portion 124. Since the barb portion 134 of the water-proof glue member 130 is adhered to the inner surface of the first end portion 124 of the hard supporting tube 123, an contact area between the water-proof glue member 130 and the hard supporting tube 123 is increased, and the water-proof glue member 130 is attached to the wall surface 113 of the outer case 110 surrounding the hole 112.

When a user pulls the wire assembly 120, the hard supporting tube 123 may be firmly fixed to the wall surface 113 of the outer case 110 surrounding the hole 112, and is not easily pulled out of the outer case 110. In other words, the barb portion 134 of the water-proof glue member 130 may increase the stability between the hard supporting tube 123 and the outer case 110, thereby increasing the stability between the wire assembly 120 and the outer case 110.

In the present embodiment, an outer diameter of the hard supporting tube 123 is greater than or equal to an inner diameter of the flexible tube 122. Therefore, the hard supporting tube 123 slightly stretches the flexible tube 122 apart. Certainly, in other embodiments, the outer diameter of the hard supporting tube 123 may also be equal to the inner diameter of the flexible tube 122, or the outer diameter of the hard supporting tube 123 may also be slightly less than the inner diameter of the flexible tube 122.

In addition, in the present embodiment, the electronic device 100 further includes a flexible water-proof member 140 sleeved at a junction of the outer case 110 and a position at which the wire assembly 120 passes through the outer case 110. The flexible water-proof member 140 may be silicone or rubber formed through injection molding or hot pressing molding, but is not limited thereto.

In the present embodiment, the flexible water-proof member 140 includes a first part 142 and a second part 144 respectively pressing against the outer case 110 and the wire assembly 120, to prevent an external liquid from flowing into the junction of positions at which the wire assembly 120 passes through the outer case 110.

In addition, in the present embodiment, the second part 144 of the flexible water-proof member 140 is pressed against the wire assembly 120 exposed from the outer case 110. Since the hard supporting tube 123 extends outside the outer case 110, the hard supporting tube 123 may support the second part 144 of the flexible water-proof member 140 well, thereby effectively achieving the waterproof effect.

In other words, in the present embodiment, the flexible water-proof member 140 is sleeved at the junction of the outer case 110 and the wire assembly 120 to provide a first waterproof effect of the electronic device 100. The waterproof glue member 130 closes the gap between the wall surface 113 of the outer case 110 and the wire assembly 120, and may provide a second waterproof effect of the electronic device 100. By disposing the hard supporting tube 123, the stability of the dual waterproof design may be effectively improved.

In addition, an outer surface of the outer case 110 is a conical surface 116 inclined toward the second part 144 of the flexible water-proof member 140 at a position beside the hole 112, and the water-proof glue member 130 has an inclined corner portion 136 extending to the conical surface 116. Such a design may increase the contact area between the water-proof glue member 130 and the outer case 110, thereby increasing the stability between the two.

Figure 3:
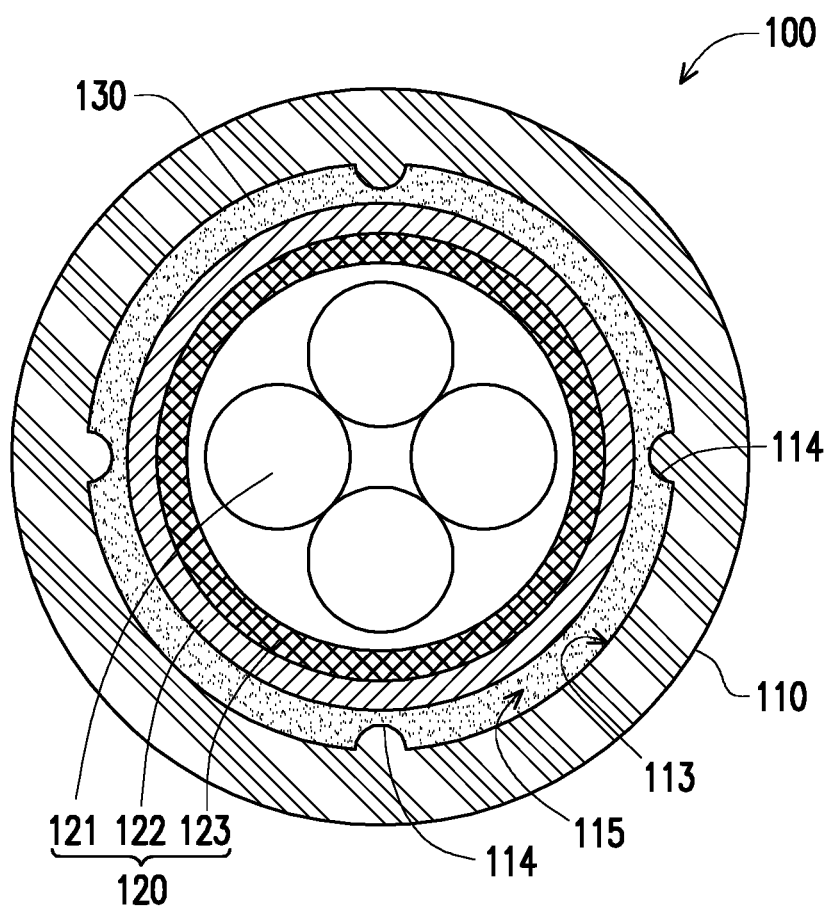
FIG. 3 is a schematic cross-sectional view of the electronic device of FIG. 1 from another viewing angle.

FIG. 3 is a schematic cross-sectional view of the electronic device of FIG. 1 from another viewing angle. Referring to FIG. 3, in the present embodiment, an outer case 110 of an electronic device 100 includes a plurality of positioning ribs 114 located in a hole 112 and protruding from a wall surface 113. The plurality of positioning ribs 114 extend in an axial direction (that is, a direction of ejection or injection into FIG. 3) of the hole 112, and are in a projection-like shape from the perspective of FIG. 3.

The wire assembly 120 is located between the plurality of positioning ribs 114, and the positioning ribs 114 may be used to maintain the wire assembly 120 at a position close to the center in the hole 112. A plurality of glue grooves 115 are formed between the positioning ribs 114. The waterproof glue member 130 is at least located in the plurality of glue grooves 115. These positioning ribs 114 may make the glue groove 115 provide enough dispensing space for enough glue members to flow in, and may provide sufficient water-proof glue members 130 between the wire assembly 120 and the surrounding wall surface 113, resulting in a good fixing and waterproof effect.

Figure 4:
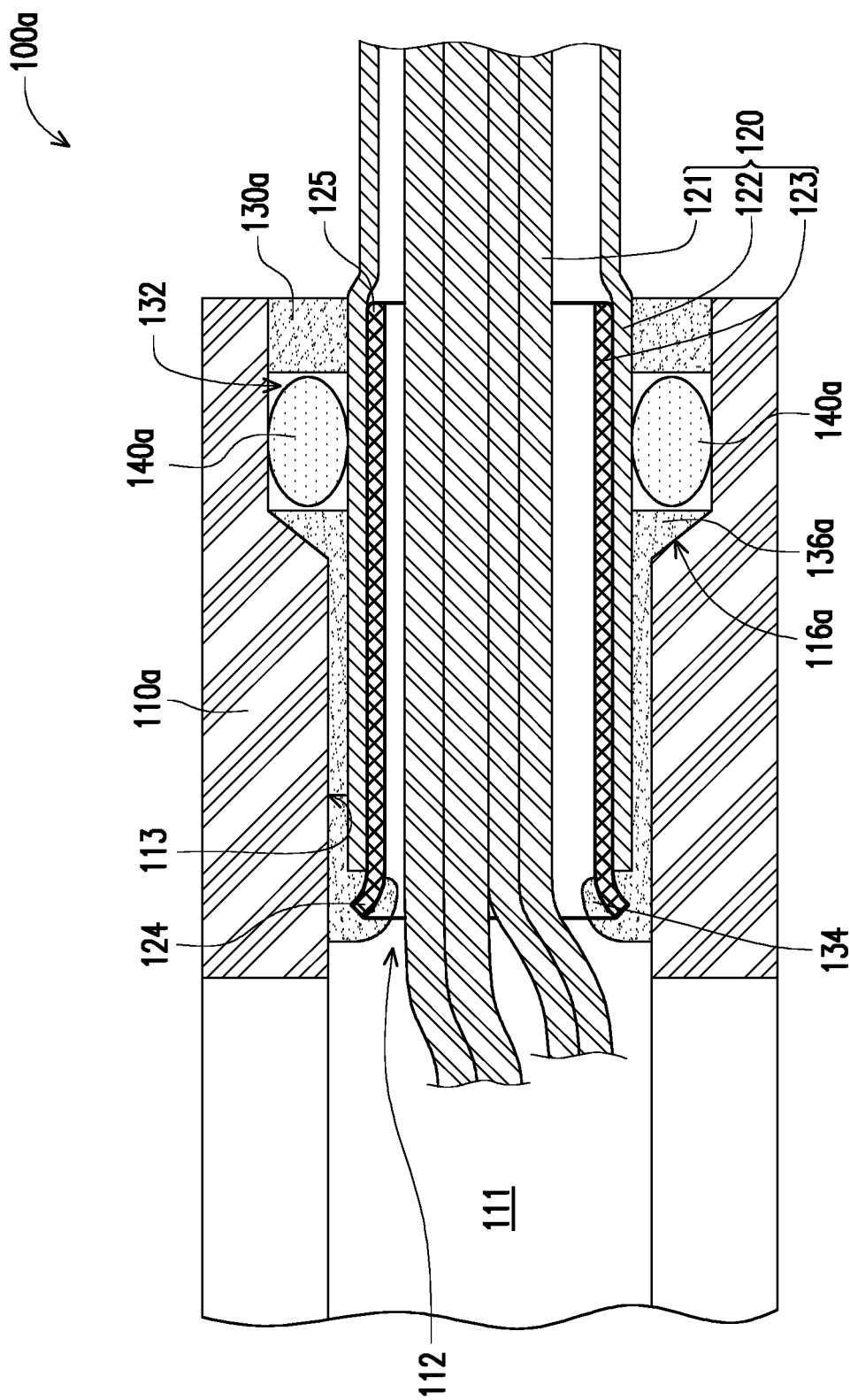
FIG. 4 is a schematic partial cross-sectional view of an electronic device according to another embodiment of the disclosure.

FIG. 4 is a schematic partial cross-sectional view of an electronic device according to another embodiment of the disclosure. Referring to FIG. 4, a main difference between an electronic device 100a of the present embodiment and the electronic device 100 of FIG. 1 is that a second end portion 125 of a hard supporting tube 123 of the electronic device 100a of the present embodiment is located outside an outer case 110a or located in a hole 112 and away from an inner space 111. In other words, in the present embodiment, only the hard supporting tube 123 is located in the hole 112 of the outer case 110a, and extends from a position close to the inner space 111 in the hole 112 to a position (that is, an edge close to the outer case 110a) away from the inner space 111.

Certainly, in other embodiments, a first end portion 124 of the hard supporting tube 123 may also be located in the inner space 111 of the outer case 110a or in the hole 112 and close to the inner space 111, and a second end portion 125 may be located outside the outer case 110a or in the hole 112 and away from the inner space 111, as long as the hard supporting tube 123 at least corresponds to the position of the water-proof glue member 130a, which is not limited to the above.

In addition, in the present embodiment, a flexible water-proof member 140a is located in the hole 112 of the outer case 110a and is sleeved on a wire assembly 120, to simultaneously press against the outer case 110a outward and the wire assembly 120 inward. Specifically, the water-proof glue member 130a has an annular recess 132 corresponding to a local portion, and the flexible water-proof member 140a is disposed in the annular recess 132. The flexible water-proof member 140a is, for example, an O-ring, but is not limited thereto. As shown in FIG. 4, the flexible water-proof member 140a corresponds to the hard supporting tube 123, so that the wire assembly 120 may provide sufficient support for the flexible water-proof member 140a.

In the present embodiment, the wall surface 113 of the outer case 110a has a conical surface 116a inclined outward, and the water-proof glue member 130a has an inclined corner portion 136a extending to the conical surface 116a. Such a design may increase the contact area between the water-proof glue member 130a and the outer case 110a, thereby increasing the stability between the two.

Based on the above, in the electronic device of the disclosure, a hard supporting tube is disposed between the wire and the flexible tube, and the hard supporting tube is located inside the flexible tube and is capable of providing support for the flexible tube. In this way, the probability of collapse or deformation of the flexible tube of the wire assembly may be reduced, the probability of rupture of the water-proof glue member between the wall surface of the outer case around the hole and the wire assembly is thereby reduced, and waterproof stability is further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic device, comprising:
   an outer case having an inner space and a hole communicating with the inner space;
   a wire assembly extending from the inner space of the outer case to outside of the outer case through the hole, comprising a plurality of wires, a flexible tube covering the plurality of wires, and a hard supporting tube located between the plurality of wires and the flexible tube; and a water-proof glue member disposed between a wall surface of the outer case surrounding the hole and the wire assembly, wherein the hard supporting tube is at least located in the hole and at least surrounds positions of the plurality of wires corresponding to the wall surface.

2. The electronic device according to claim 1, wherein an outer diameter of the hard supporting tube is greater than or equal to an inner diameter of the flexible tube.

3. The electronic device according to claim 1, wherein the hard supporting tube has a first end portion and a second end portion opposite to each other, the first end portion is located in the inner space of the outer case or in the hole and close to the inner space, the second end portion is located outside the outer case or in the hole and away from the inner space, and the first end portion is in a horn shape that expands toward the inner space.

4. The electronic device according to claim 3, wherein the second end portion has a chamfer or a rounded corner.

5. The electronic device according to claim 3, wherein the water-proof glue member has a barb portion extending to an inner surface of the first end portion.

6. The electronic device according to claim 1, further comprising:

a flexible water-proof member sleeved at a junction of the outer case and a position at which the wire assembly passes through the outer case, wherein the flexible water-proof member comprises a first part and a second part respectively pressing against the outer case and the wire assembly, and the second part corresponds to a local portion of the hard supporting tube.

7. The electronic device according to claim 6, wherein an outer surface of the outer case is a conical surface inclined toward the second part at a position beside the hole, and the water-proof glue member has an inclined corner portion extending to the conical surface.

8. The electronic device according to claim 1, further comprising:

a flexible water-proof member located in the hole of the outer case and sleeved on the wire assembly to press against the outer case and the wire assembly, wherein the flexible water-proof member corresponds to a local portion of the hard supporting tube.

9. The electronic device according to claim 8, wherein the wall surface has a conical surface inclined outward, and the water-proof glue member has an inclined corner portion extending to the conical surface.

10. The electronic device according to claim 8, wherein the water-proof glue member has an annular recess corresponding to the local portion, and the flexible water-proof member is disposed in the annular recess.

11. The electronic device according to claim 1, wherein the outer case comprises a plurality of positioning ribs located in the hole and protruding from the wall surface, the plurality of positioning ribs extend in an axial direction of the hole, the wire assembly is located between the plurality of positioning ribs, a plurality of glue grooves are formed among the plurality of positioning ribs, and the water-proof glue member is at least located in the plurality of glue grooves.

* * * * *